United States Patent
Tian et al.

(10) Patent No.: US 9,768,312 B2
(45) Date of Patent: Sep. 19, 2017

(54) THIN FILM TRANSISTOR, MANUFACTURING METHOD THEREOF, ARRAY SUBSTRATE, AND DISPLAY DEVICE

(71) Applicant: BOE TECHNOLOGY GROUP CO., LTD., Beijing (CN)

(72) Inventors: Hongwei Tian, Beijing (CN); Yanan Niu, Beijing (CN); Zuqiang Wang, Beijing (CN); Liang Sun, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/913,048

(22) PCT Filed: Jul. 20, 2015

(86) PCT No.: PCT/CN2015/084439
§ 371 (c)(1),
(2) Date: Feb. 19, 2016

(87) PCT Pub. No.: WO2016/155154
PCT Pub. Date: Oct. 6, 2016

(65) Prior Publication Data
US 2017/0040464 A1     Feb. 9, 2017

(30) Foreign Application Priority Data
Apr. 3, 2015     (CN) .......................... 2015 1 0158315

(51) Int. Cl.
*H01L 29/786*     (2006.01)
*H01L 21/77*      (2017.01)
(Continued)

(52) U.S. Cl.
CPC .. *H01L 29/78675* (2013.01); *H01L 21/02532* (2013.01); *H01L 21/02592* (2013.01);
(Continued)

(58) Field of Classification Search
CPC ................................................ H01L 29/78672
See application file for complete search history.

(56) References Cited

U.S. PATENT DOCUMENTS

2008/0157116 A1*  7/2008  Park ................. H01L 21/02532
                                                      257/101

FOREIGN PATENT DOCUMENTS

CN     1577772 A     2/2005
CN     1581450 A     2/2005
(Continued)

OTHER PUBLICATIONS

International Search Report dated Jan. 13, 2016 issued in corresponding International Application No. PCT/CN2015/084439 along with the English translation of the Written Opinion of the International Searching Authority.

*Primary Examiner* — Cuong Q Nguyen
*Assistant Examiner* — Nishath Yasmeen
(74) *Attorney, Agent, or Firm* — Nath, Goldberg & Meyer; Joshua B. Goldberg; Christopher Thomas

(57) ABSTRACT

Embodiments of the present invention disclose a manufacturing method of a thin film transistor, a thin film transistor, an array substrate and a display device. The manufacturing method of a thin film transistor includes a step of forming an active layer, and the step of forming an active layer includes: forming a first poly-silicon layer and a second poly-silicon layer on the first poly-silicon layer separately, and adding dopant ions into the second poly-silicon layer and an upper surface layer of the first poly-silicon layer. By using the manufacturing method of a thin film transistor, defect states and unstable factors of interface in the thin film transistor can be reduced, thereby improving stability of the LTPS thin film transistor and obtaining an array substrate and a display device having more stable performance.

12 Claims, 2 Drawing Sheets

(51) Int. Cl.
  *H01L 21/02*    (2006.01)
  *H01L 21/225*   (2006.01)
  *H01L 21/30*    (2006.01)
  *H01L 21/306*   (2006.01)
  *H01L 27/12*    (2006.01)
  *H01L 29/10*    (2006.01)
  *H01L 29/66*    (2006.01)

(52) U.S. Cl.
  CPC .... *H01L 21/02675* (2013.01); *H01L 21/2251* (2013.01); *H01L 21/3003* (2013.01); *H01L 21/30604* (2013.01); *H01L 21/77* (2013.01); *H01L 27/1222* (2013.01); *H01L 27/1285* (2013.01); *H01L 29/1033* (2013.01); *H01L 29/66757* (2013.01); *H01L 29/786* (2013.01); *H01L 29/78696* (2013.01)

(56) References Cited

FOREIGN PATENT DOCUMENTS

| | | |
|---|---|---|
| CN | 101211985 A | 7/2008 |
| CN | 104716200 A | 6/2015 |

* cited by examiner

THIN FILM TRANSISTOR, MANUFACTURING METHOD THEREOF, ARRAY SUBSTRATE, AND DISPLAY DEVICE

This is a National Phase Application filed under 35 U.S.C. 371 as a national stage of PCT/CN2015/084439 filed on Jul. 20, 2015, an application claiming the benefit of Chinese Application No. 201510158315.3 filed on Apr. 3, 2015, the content of each of which is hereby incorporated by reference in its entirety.

FIELD OF THE INVENTION

The present invention relates to the field of display technology, in particular to a thin film transistor, a manufacturing method thereof, an array substrate and a display device.

BACKGROUND OF THE INVENTION

Low Temperature Poly-Silicon (LTPS for short) thin film transistors have higher electron mobility compared with conventional amorphous silicon thin film transistors. The electron mobility of a LTPS thin film transistor can generally reach 50-200 $cm^2$/V-sec, and thus the area of channel can be effectively reduced, so that the area of the thin film transistor can be reduced. By applying the LTPS thin film transistors in a display device, the aperture ratio and integration of the display device can be improved, and as a result, the brightness of the display device can be improved while the power consumption thereof is reduced.

LTPS is generally used for forming an active layer of a thin film transistor. At present, preparation process for an active layer includes steps of: depositing amorphous silicon (a-Si) first; then converting the amorphous silicon into poly-silicon (P-Si) by Excimer Laser Annealing (ELA for short); and subsequently, adding dopant ions by ion implantation to adjust the threshold voltage (Vth) of the thin film transistor. In the process of adding dopant ions by ion implantation, the interface of the poly-silicon is inevitably damaged by high-energy ions, and can only be repaired incompletely even after subsequent high-temperature annealing, which deteriorates stability of the thin film transistor; meanwhile, the energy of ion implantation itself has a certain distribution, in the subsequent activation process, the doped ions can hardly be distributed evenly and bonded tightly with the neighboring atoms, which makes the thin film transistor even more unstable under the impact of external energy such as heat, light and electricity.

Research results indicate that, interface characteristics have a remarkable effect on the overall characteristics of the thin film transistor, and therefore, the interface needs to have relatively high stability and other excellent properties. Since the interface and crystalline portion of poly-silicon may be damaged and have a relatively low stability, the stability and other properties of the thin film transistor are impacted. Research results further indicate that the main reason why the thin film transistor is unstable lies in the defect states, dangling bonds, movable ions, and the like near the interface, and the defect states at the P-Si side have a great impact on the stability of the device.

SUMMARY OF THE INVENTION

In view of the above drawbacks existing in the prior art, the technical problem to be solved by the present invention is to provide a manufacturing method of a thin film transistor, a thin film transistor, an array substrate and a display device. By using the manufacturing method of a thin film transistor, defect states and unstable factors of interface in the thin film transistor can be reduced, thereby improving stability of the LTPS thin film transistor and achieving more stable performance of the array substrate and the display device.

To solve the technical problem of the present invention, according to one aspect of the present invention, there is provided a manufacturing method of a thin film transistor including a step of forming an active layer, wherein the step of forming an active layer includes: forming a first poly-silicon layer and a second poly-silicon layer on the first poly-silicon layer separately, and adding dopant ions into the second poly-silicon layer and an upper surface layer of the first poly-silicon layer.

Preferably, the step of forming an active layer specifically includes:

forming a first amorphous silicon layer;

performing a first excimer laser annealing, so as to convert the first amorphous silicon layer into the first poly-silicon layer;

forming a second amorphous silicon layer on an upper surface of the first poly-silicon layer, and adding the dopant ions in the process of forming the second amorphous silicon layer; and performing a second excimer laser annealing, so as to melt the upper surface layer of the first poly-silicon layer and cause the second amorphous silicon layer to grow on the surface of the first poly-silicon layer, thereby forming the second poly-silicon layer and adding the dopant ions into the upper surface layer of the first poly-silicon layer.

Preferably, before forming the first amorphous silicon layer, the manufacturing method further includes a step of forming a buffer layer.

Preferably, between forming the first amorphous silicon layer and performing the first excimer laser annealing, the manufacturing method further includes: performing a first dehydrogenation process; and between forming the second amorphous silicon layer and performing the second excimer laser annealing, the manufacturing method further includes: performing a second dehydrogenation process.

Preferably, before forming the second amorphous silicon layer on the upper surface of the first poly-silicon layer, the manufacturing method further includes: performing a surface treatment on the first poly-silicon layer;

wherein the surface treatment is performed on the first poly-silicon layer by using hydrofluoric acid—ozone water—hydrofluoric acid—hydrogen water.

Preferably, in the process of performing the second excimer laser annealing, laser energy is controlled such that thickness of the melt upper surface layer of the first poly-silicon layer is no larger than 10 nm.

Preferably, the laser energy is controlled by lowering scanning energy and/or scanning step frequency in the second excimer laser annealing.

Preferably, the manufacturing method further includes steps of forming a gate, a source and a drain.

Preferably, the first amorphous silicon layer has a thickness in the range of 30 nm to 50 nm; the second amorphous silicon layer has a thickness in the range of 2 nm to 10 nm.

According to another aspect of the present invention, there is provided a thin film transistor comprising a gate, a source, a drain and an active layer, wherein the active layer includes a poly-silicon layer and dopant ions provided in an upper surface layer of the poly-silicon layer.

Preferably, the poly-silicon layer has a thickness in the range of 32 nm to 60 nm, and a part of the poly-silicon layer that is provided with the dopant ions has a thickness in the range of 12 nm to 20 nm.

According to still another aspect of the present invention, there is provided an array substrate comprising the above thin film transistor.

According to yet another aspect of the present invention, there is provided a display device comprising the above array substrate.

The beneficial effects of the present invention are as follows.

In the manufacturing method of a thin film transistor, bombardment and damage to the surface of poly-silicon P-Si during channel doping is avoided mainly by optimizing crystallization and doping process of the active layer, thereby reducing defect states and dangling bonds at the surface of poly-silicon P-Si caused by bombardment. Meanwhile dopant ions are concentrated in a relatively narrow region close to the interface by forming poly-silicon layers P-Si separately, and compared with a thin film transistor device in which dopant ions are widely distributed, distributions of deep traps and charged impurities are reduced, and thereby unstable factors near the interface such as defect states, dangling bonds, movable ions and the like are reduced. It can be seen that, the manufacturing method of a thin film transistor can improve and optimize properties and other aspect of a LTPS (Low Temperature Poly-Silicon) thin film transistor, as a result, defect states and other unstable factors in the thin film transistor are reduced, stability of the thin film transistor is improved and overall performance of the thin film transistor is improved as well.

The array substrate can achieve more stable performance because it adopts thin film transistors having relatively high stability.

The display device can achieve more stable performance because it adopts thin film transistors having relatively high stability and the corresponding array substrate.

DESCRIPTION OF THE PREFERRED EMBODIMENT

To enable those skilled in the art to better understand the technical solutions of the present invention, a manufacturing method of a thin film transistor, a thin film transistor, an array substrate and a display device provided by the present invention will be described in detail below in conjunction with the accompanying drawings and the specific implementations.

Embodiment 1:

The embodiment provides a manufacturing method of a thin film transistor and a thin film transistor manufactured by using the manufacturing method. By using the manufacturing method of a thin film transistor, defect states and other unstable factors of the interface in the thin film transistor can be reduced, and the thin film transistor formed by using the manufacturing method of a thin film transistor has relatively high stability and relatively good performance.

The manufacturing method of a thin film transistor provided by the embodiment includes a step of forming an active layer, and the step of forming an active layer includes: forming a first poly-silicon layer and a second poly-silicon layer on the first poly-silicon layer separately, and doping dopant ions into the second poly-silicon layer and an upper surface layer of the first poly-silicon layer.

Thereinafter, the manufacturing method of a thin film transistor is described in detail with reference to the accompanying drawings. Specifically, the step of forming an active layer may specifically include steps as follows.

At step S1, a first amorphous silicon layer is formed.

For a top-gate thin film transistor, in order to prevent the active layer from being influenced by impurities in a base substrate (generally a base substrate made of glass), the manufacturing method may include, before the step of forming a first amorphous silicon layer, a step of forming a buffer layer.

Figure 1:
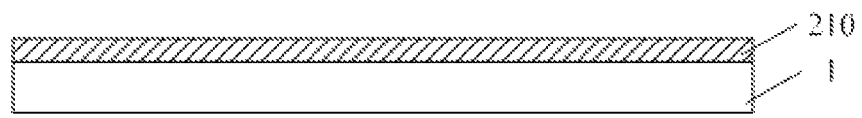
FIG. 1 is a schematic structural diagram of forming a first amorphous silicon layer in a manufacturing method of a thin film transistor provided by Embodiment 1 of the present invention.

As shown in FIG. 1, a buffer layer 1 is deposited on a base substrate first, and then a first amorphous silicon layer (a-Si) 210 formed by amorphous silicon is deposited on the buffer layer 1. The thickness of the first amorphous silicon layer 210 may range from 30 nm to 50 nm, and preferably, the thickness of the first amorphous silicon layer 210 is 40 nm.

At step S2, a first excimer laser annealing is performed, so as to convert the first amorphous silicon layer 210 into a first poly-silicon layer.

Figure 2:
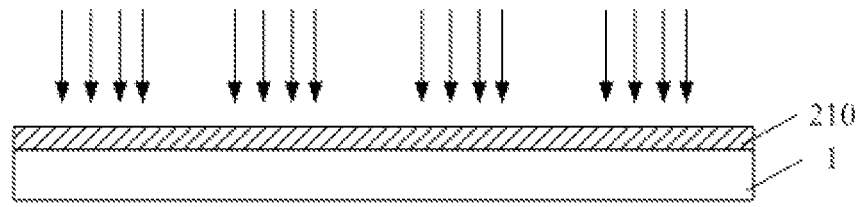
FIG. 2 is a schematic diagram of performing excimer laser annealing on the first amorphous silicon layer shown in FIG. 1 in the manufacturing method of a thin film transistor provided by Embodiment 1 of the present invention.
Figure 3:
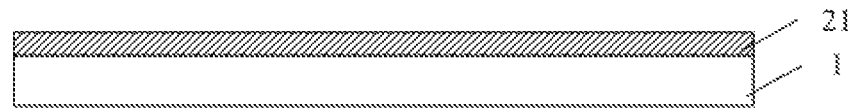
FIG. 3 is a schematic structural diagram of forming a first poly-silicon layer in the manufacturing method of a thin film transistor provided by Embodiment 1 of the present invention.

As shown in FIG. 2, excimer laser annealing, i.e., laser crystallization process, is performed to convert the first amorphous silicon layer 210 into the first poly-silicon layer (P-Si) 21 shown in FIG. 3.

It should be noted that, in the process of depositing amorphous silicon, element hydrogen may widely exist in silicon Si through hydrogen bond and Van der Waals force, and during excimer laser annealing (ELA), element hydrogen may escape in the form of hydrogen $H_2$ and react with oxygen $O_2$ to cause hydrogen explosion. Therefore, before step S2, i.e., between forming the first amorphous silicon layer 210 and performing the first excimer laser annealing, the manufacturing method may further include a step of: performing a first dehydrogenation process to remove element hydrogen, so as to prevent hydrogen explosion in the process of excimer laser annealing.

At step S3, a surface treatment is performed on the first poly-silicon layer.

After the first poly-silicon layer 21 is formed, a surface treatment is performed on a surface thereof, so as to minimize surface defects of the first poly-silicon layer 21 and improve electron-transporting property. In the step, preferably, the surface treatment is performed on the first poly-silicon layer 21 by using hydrofluoric acid HF—ozone water $O_3$—hydrofluoric acid HF—Hydrogen water $H_2$. That is, first, the surface of the first poly-silicon layer 21 is cleaned with a hydrofluoric acid solution having a low concentration (about 1%) to remove impurities, then silicon oxide is formed on the surface of the first poly-silicon layer 21 by using ozone water, further, the surface of the first poly-silicon layer 21 is cleaned with a hydrofluoric acid solution having a low concentration (about 1%) to remove impurities, and finally, the surface of the first poly-silicon layer 21 is treated by using hydrogen water.

It should be understood that, the surface treatment herein may be performed in other ways as needed, which is not limited in the present invention. Meanwhile, it should be understood that, the step of performing a surface treatment on the first poly-silicon layer is not necessarily needed, but a relatively good surface property can be obtained by performing a surface treatment before performing subsequent steps, thus ensuring relatively good effects of the subsequent steps.

At step S4, a second amorphous silicon layer is formed on the upper surface of the first poly-silicon layer subject to the surface treatment, and dopant ions are added in the process of forming the second amorphous silicon.

Figure 4:
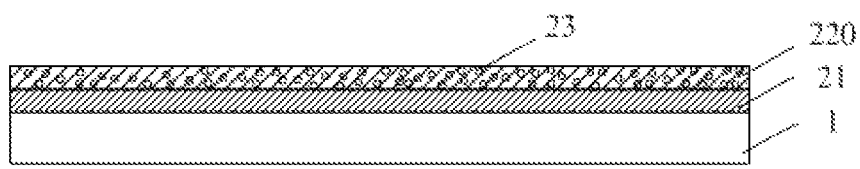
FIG. 4 is a schematic structural diagram of forming a second amorphous silicon layer on the first poly-silicon layer shown in FIG. 3 in the manufacturing method of a thin film transistor provided by Embodiment 1 of the present invention.

As shown in FIG. 4, in this step, a thin layer of amorphous silicon is deposited on the upper surface of the first poly-silicon layer 21 to form a second amorphous silicon layer 220, and dopant ions 23 are added into the second amorphous silicon layer 220 to form a doped second amorphous silicon layer 220. Here, the concentration of the dopant ions 23 generally depends on the desired threshold voltage Vth, may be set according to application of the thin film transistor and circuit requirement in practice, and is not specifically limited in the present invention.

In a LTPS thin film transistor, generally, current between source and drain (SD) is controlled by a gate, and interface between a gate insulation layer GI and the poly-silicon layer P-Si has the greatest impact on the current. In order to suppress the divergence of the dopant ions 23, the second amorphous silicon layer 220 has a smaller thickness than the first amorphous silicon layer 210. Preferably, the thickness of the second amorphous silicon layer 220 is in the range of 2 nm to 10 nm, and in such range depth of the dopant ions 23 can be easily controlled, and the interface of the poly-silicon layer with a subsequently formed layer structure (e.g., a gate insulation layer) is prevented from being damaged by high-energy ions.

At step S5, a second excimer laser annealing is performed, so as to melt the upper surface layer of the first poly-silicon layer and cause the second amorphous silicon layer to grow on the surface of the first poly-silicon layer, thereby forming the second poly-silicon layer and adding dopant ions 23 into the upper surface layer of the first poly-silicon layer.

Preferably, between forming the second amorphous silicon layer 220 and performing the second excimer laser annealing, the manufacturing method further includes a step of: performing a second dehydrogenation process to remove element hydrogen, so as to prevent hydrogen explosion in the process of excimer laser annealing.

Figure 5:
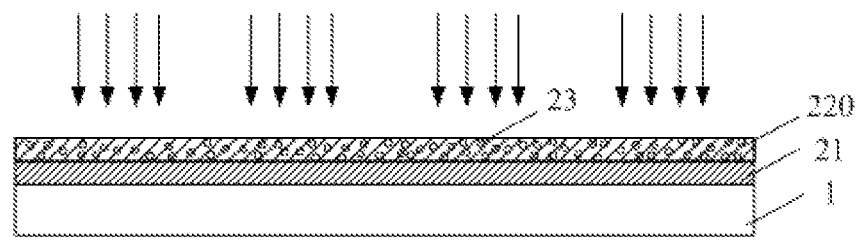
FIG. 5 is a schematic diagram of performing excimer laser annealing on the second amorphous silicon layer shown in FIG. 4 in the manufacturing method of a thin film transistor provided by Embodiment 1 of the present invention.
Figure 6:
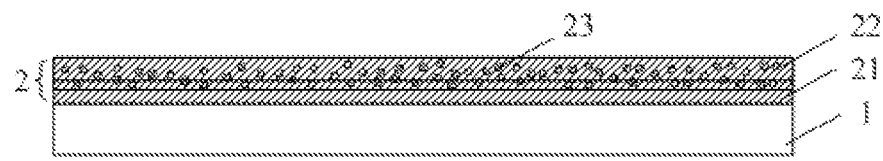
FIG. 6 is a schematic structural diagram of forming a second poly-silicon layer in the manufacturing method of a thin film transistor provided by Embodiment 1 of the present invention.

In this step, as shown in FIG. 5, in the process of performing the second excimer laser annealing (ELA), by controlling the magnitude of laser energy, the second amorphous silicon layer 220 which is relatively thin and in the upper layer is allowed to grow on the first poly-silicon layer 21 in the lower layer, while the thickness of the melt portion of the first poly-silicon layer 21 in the lower layer is minimized; as shown in FIG. 6, the second amorphous silicon layer 220 is converted to the doped second poly-silicon layer 22, and the upper surface layer of the first poly-silicon layer 21 is doped with dopant ions 23.

Preferably, laser energy in the second excimer laser annealing (ELA) is controlled such that the thickness of the melt upper surface layer of the first poly-silicon layer 21 is no larger than 10 nm. The laser energy may be controlled by reducing scanning energy of ELA and/or scanning step frequency of ELA. For example, in an existing excimer laser annealing, normal OED (optical energy density) is 420 mJ, and in this step, the optical energy density may be reduced; normal scanning step frequency is 99.75%, i.e., each region is scanned by 1/0.25%, namely, 400 times, and in this step, the scanning step frequency may be lowered. Preferably, scanning energy and scanning step frequency may both be adjusted to control the laser energy. For example, OED corresponding to the laser energy required for melting amorphous silicon a-Si having a thickness of 40 nm is 420 mJ, and OED corresponding to laser energy required for melting amorphous silicon a-Si having a thickness of 10 nm is about 150 mJ. In practical manufacturing process, adjustment may be made according to actual crystallization condition, which is not specifically limited herein.

In the thin film transistor, the first poly-silicon layer 21 and the second poly-silicon layer together form a poly-silicon layer 2, the poly-silicon layer 2 has a thickness in the range of 32 nm to 60 nm, and the part of the poly-silicon layer 2 provided with the dopant ions 23 has a thickness in the range of 12 nm to 20 nm.

Through the above steps S4 and S5, the added dopant ions 23 may be cured in the poly-silicon layer to a certain depth while forming the second amorphous silicon layer 220, which can not only effectively perform stable threshold voltage Vth adjustment on interface between the poly-silicon layer and a subsequently formed layer structure (e.g., gate insulation layer) (due to the action of the dopant ions 23), but can also avoid damage to the interface between the poly-silicon layer and the subsequently formed layer structure (e.g., gate insulation layer), thereby achieving the purpose of optimizing stability of the thin film transistor. In other words, in the manufacturing method of a thin film transistor, by improving excimer laser annealing, and performing doping and other process while performing a film formation process, defect states of poly-silicon interface are reduced, and the purpose of controlling the depth of dopant ions is achieved.

In addition, it can be understood that, the manufacturing method of a thin film transistor in the embodiment may further include steps of forming a gate, a source and a drain, and the execution sequence of the steps may be adjusted according to the designed structure of the thin film transistor. For example, according to the structure of a top-gate or bottom-gate thin film transistor, after forming an active layer by using the manufacturing method in the embodiment, a gate is further formed, or other layer structures such as a source, a drain and the like are further formed.

In an existing manufacturing method of a thin film transistor, a normal doping process is adopted in the process of forming an active layer, or dopant ions are added directly in the process of depositing amorphous silicon. In the case that a normal doping process is adopted, an excimer laser annealing device is less occupied, but certain interface damage may be caused and active ions exist in the thin film transistor, and thus, the stability of the thin film transistor is lowered and doping divergence needs to be controlled accurately. In the case that dopant ions are added directly in the process of depositing amorphous silicon, occupation of a doping device can be reduced, but as amorphous silicon itself has a relatively large thickness (generally larger than 45 nm), in the excimer laser annealing, amorphous silicon that is in a melted state repeatedly has a relatively large flowability, and thus, it is particularly difficult to control distribution of the dopant ions in the process of crystallizing amorphous silicon to poly-silicon, which brings great uncertainty. Compared with the above two existing methods for forming an active layer, in the manufacturing method of a thin film transistor in the embodiment, occupation of an excimer laser annealing device is substantially equivalent to (about 1.5 to 1.8 times as much as) that of the device in the case of normal doping process, but defects of and damages to the thin film transistor can be reduced to a relatively large extent, and occupation of a doping device can be reduced.

Correspondingly, the embodiment also provides a thin film transistor, which is formed by using the above manufacturing method of a thin film transistor. The thin film transistor includes a gate, a source, a drain, and an active layer. As shown in FIG. 6, the active layer includes a poly-silicon layer 2 and dopant ions 23 provided in an upper surface layer of the poly-silicon layer 2.

In the thin film transistor, the poly-silicon layer 2 has a thickness in the range of 32 nm to 60 nm, and the part of the poly-silicon layer 2 that is provided with the dopant ions 23 has a thickness in the range of 12 nm to 20 nm. The poly-silicon layer 2 is formed by performing film formation process of depositing amorphous silicon twice and excimer laser annealing process twice. Specifically, a poly-silicon layer in a lower layer is formed by depositing amorphous silicon for the first time and performing excimer laser annealing for the first time, then an amorphous silicon layer in an upper layer is formed by depositing for the second time and meanwhile dopant ions 23 are added, and a poly-silicon layer in the upper layer is formed by using excimer laser annealing with relatively low energy, such that the dopant ions 23 exist only in the upper surface layer of the poly-silicon layer 2.

In the above manufacturing method of a thin film transistor, bombardment and damage to the surface of poly-silicon P-Si during channel doping is avoided mainly by optimizing crystallization and doping processes of the active layer, thereby reducing defect states and dangling bonds at the surface of poly-silicon P-Si caused by bombardment. Meanwhile dopant ions are concentrated in a relatively narrow region close to the interface by forming poly-silicon layers P-Si separately, and compared with a thin film transistor device in which dopant ions are widely distributed, distributions of deep traps and charged impurities are reduced, and thereby unstable factors near the interface such as defect states, dangling bonds, movable ions and the like are reduced. It can be seen that, the manufacturing method of a thin film transistor can improve and optimize properties and other aspect of a LTPS thin film transistor, as a result, defect states and other unstable factors in the thin film transistor are reduced, stability of the thin film transistor is improved and overall performance of the thin film transistor is improved as well.

Embodiment 2

This embodiment provides an array substrate comprising the thin film transistor in Embodiment 1, and the array substrate is applicable to liquid crystal display devices and OLED display devices.

The array substrate in the embodiment may include other layer structures such as a passivation layer, a pixel electrode layer (for a liquid crystal display device) or a pixel define layer (for an OLED display device), and the like. The specific structures and manufacturing process of these layer structures may refer to those in the prior art, and are not repeatedly described herein.

The array substrate can achieve more stable performance because it adopts thin film transistors having relatively high stability.

Embodiment 3:

This embodiment provides a display device comprising the array substrate in Embodiment 2.

The display device may be any product or component having a display function, such as a liquid crystal panel, electronic paper, an OLED panel, a mobile phone, a tablet computer, a television, a display, a notebook computer, a digital photo frame, a navigator, or the like.

The display device can achieve more stable performance because it adopts thin film transistors having relatively high stability and the corresponding array substrate.

It could be understood that the foregoing implementations are merely exemplary implementations for describing the principle of the present invention, but the present invention is not limited thereto. A person of ordinary skill in the art may make various modifications and improvements without departing from the spirit and essence of the present invention, and these modifications and improvements shall fall into the protection scope of the present invention.

The invention claimed is:

1. A manufacturing method of a thin film transistor, comprising a step of forming an active layer, wherein the step of forming an active layer comprises:
   forming a first amorphous silicon layer;
   performing a first excimer laser annealing, so as to convert the first amorphous silicon layer into a first poly-silicon layer;
   forming a second amorphous silicon layer on an upper surface of the first poly-silicon layer, and adding dopant ions in the process of forming the second amorphous silicon layer; and
   performing a second excimer laser annealing, so as to melt the upper surface layer of the first poly-silicon layer and cause the second amorphous silicon layer to grow into the molten upper surface of the first poly-silicon layer, thereby forming a second poly-silicon layer, wherein the dopant ions are added into the molten upper surface layer of the first poly-silicon layer.

2. The manufacturing method of a thin film transistor according to claim 1, further comprising, before forming the first amorphous silicon layer, a step of forming a buffer layer.

3. The manufacturing method of a thin film transistor according to claim 1, wherein, between forming the first amorphous silicon layer and performing the first excimer laser annealing, the manufacturing method further comprises: performing a first dehydrogenation process; and between forming the second amorphous silicon layer and performing the second excimer laser annealing, the manufacturing method further comprises: performing a second dehydrogenation process.

4. The manufacturing method of a thin film transistor according to claim 1, further comprising, before forming the second amorphous silicon layer on the upper surface of the first poly-silicon layer, a step of: performing a surface treatment on the first poly-silicon layer;

wherein the surface treatment is performed on the first poly-silicon layer by using hydrofluoric acid HF—ozone water O3—hydrofluoric acid HF—hydrogen water H2.

5. The manufacturing method of a thin film transistor according to claim 1, wherein in the process of performing the second excimer laser annealing, laser energy is controlled such that thickness of the melt upper surface layer of the first poly-silicon layer is no larger than 10 nm.

6. The manufacturing method of a thin film transistor according to claim 5, wherein the laser energy is controlled by lowering scanning energy and/or scanning step frequency in the second excimer laser annealing.

7. The manufacturing method of a thin film transistor according to claim 1, wherein the first amorphous silicon layer has a thickness in the range of 30 nm to 50 nm; and the second amorphous silicon layer has a thickness in the range of 2 nm to 10 nm.

8. The manufacturing method of a thin film transistor according to claim 2, wherein the first amorphous silicon layer has a thickness in the range of 30 nm to 50 nm; and the second amorphous silicon layer has a thickness in the range of 2 nm to 10 nm.

9. The manufacturing method of a thin film transistor according to claim 3, wherein the first amorphous silicon layer has a thickness in the range of 30 nm to 50 nm; and the second amorphous silicon layer has a thickness in the range of 2 nm to 10 nm.

10. The manufacturing method of a thin film transistor according to claim 4, wherein the first amorphous silicon layer has a thickness in the range of 30 nm to 50 nm; and the second amorphous silicon layer has a thickness in the range of 2 nm to 10 nm.

11. The manufacturing method of a thin film transistor according to claim 5, wherein the first amorphous silicon layer has a thickness in the range of 30 nm to 50 nm; and the second amorphous silicon layer has a thickness in the range of 2 nm to 10 nm.

12. The manufacturing method of a thin film transistor according to claim 6, wherein the first amorphous silicon layer has a thickness in the range of 30 nm to 50 nm; and the second amorphous silicon layer has a thickness in the range of 2 nm to 10 nm.

* * * * *